United States Patent [19]

Rosenfeldt et al.

[11] E Patent Number: Re. 33,513

[45] Reissued Date of Patent: Jan. 1, 1991

[54] INSULATED INSERT WITH HIGH ELECTRIC STRENGTH

[75] Inventors: Bernd Rosenfeldt; Gerhard Weller; Edmund Reis, all of Erlangen, Fed. Rep. of Germany

[73] Assignee: Siemens Aktiengesellschaft, Berlin and Munich, Fed. Rep. of Germany

[21] Appl. No.: 735,074

[22] Filed: Jan. 1, 1991

Related U.S. Patent Documents

Reissue of:

[64] Patent No.: 4,384,368
Issued: May 17, 1983
Appl. No.: 262,212
Filed: May 8, 1981

[30] Foreign Application Priority Data

May 22, 1980 [DE] Fed. Rep. of Germany ..... 3019645

[51] Int. Cl.[5] ..... H04B 10/00

[52] U.S. Cl. ..... 455/602; 250/551; 361/392; 361/394; 361/412; 361/415; 361/424

[58] Field of Search ..... 361/390, 391, 392, 394, 361/399, 415, 395, 362; 455/602, 600; 250/551

[56] References Cited

U.S. PATENT DOCUMENTS

| | | | |
|---|---|---|---|
| 3,011,098 | 11/1961 | Godley | 361/391 |
| 3,270,252 | 8/1966 | Iverson | 361/424 |
| 3,631,325 | 12/1971 | Wenz | 361/386 |
| 3,714,515 | 1/1973 | Lee | 361/392 |
| 3,845,253 | 10/1974 | Hanneman et al. | 361/391 |
| 4,070,081 | 1/1978 | Takahashi | 361/399 |
| 4,153,127 | 5/1979 | Klink et al. | 361/392 |
| 4,236,086 | 11/1980 | Hoebel | 306/149 |

FOREIGN PATENT DOCUMENTS

| | | |
|---|---|---|
| 1366134 | 9/1974 | United Kingdom . |
| 1383577 | 2/1975 | United Kingdom . |
| 1447469 | 8/1976 | United Kingdom . |

*Primary Examiner*—Joseph A. Orsino
*Assistant Examiner*—L. Van Beek
*Attorney, Agent, or Firm*—Hill, Van Santen, Steadman & Simpson

[57] ABSTRACT

The object of the disclosure is to construct an insert which, given the simplest structure, is optimally insulated and and voltage-stable. This goal is achieved in that the insert is composed of a jacket housing of highly insulating synthetic, for example, amino-butadienestyrol (ABS) or the like, and of a layer packet comprised of at least two shielding plates of, for example, aluminum or sheet steel, with a printed circuit board structure seated between them as a carrier for those components which are required for the energy and/or signal transmission, said layer packet being designed so as to be insertable into the highly insulating jacket housing.

20 Claims, 7 Drawing Sheets

INSULATED INSERT WITH HIGH ELECTRIC STRENGTH

Matter enclosed in heavy brackets [ ] appears in the original patent but forms no part of this reissue specification; matter printed in italics indicates the additions made by reissue.

SUMMARY OF THE INVENTION

The invention relates to an insulated insert with high electric strength for insertion into the recess of a device housing.

The object of the invention is to construct an insert which, given the simplest structure, is optimally insulated and voltage stable.

The object is inventively achieved in that the insert is composed of a jacket housing of highly insulating synthetic material, for example, amino-butadiene-styrol (ABS) or the like, and of a layer packet comprised of at least two shielding plates, for example of aluminum or nonmagnetic sheet steel, with a printed circuit board structure seated between them and a carrier for those components which are necessary for the energy and/or signal transmission, said layer packet being designed so as to be insertable into the highly insulating jacket housing.

Further advantages and details of the invention from the following description of an exemplary embodiment on the basis of the accompanying sheets of drawings in conjunction with the subclaims; and other objects, features and advantages will be apparent from this detailed disclosure and from the appended claims.

DETAILED DESCRIPTION

Figure 1:
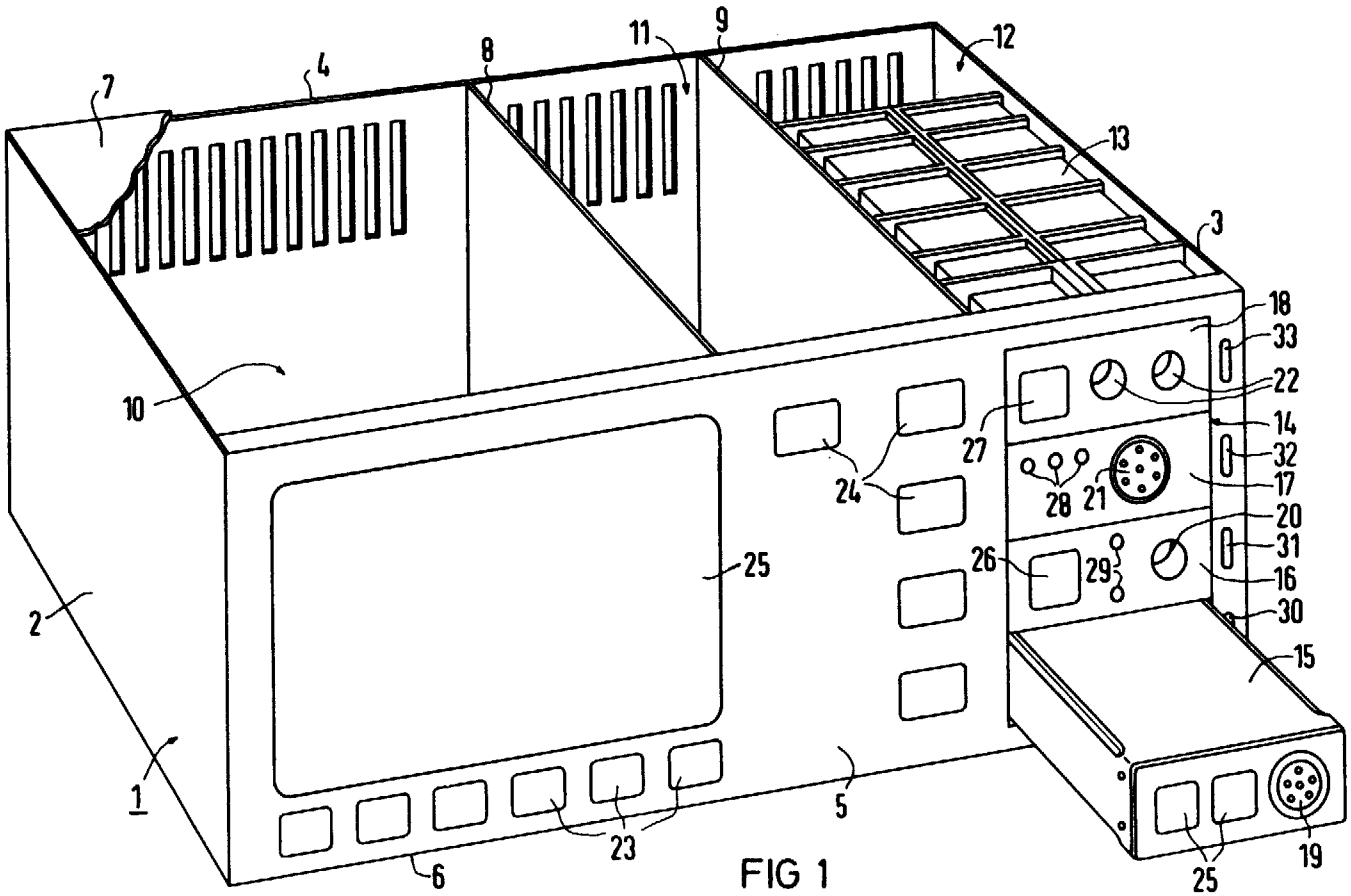
FIG. 1 shows a device according to the invention in an oblique view.

FIG. 1 shows the device with a device housing 1 constructed in dimensions specified in inches with sidewalls 2 and 3, a back wall 4 and a front panel 5, a bottom plate 6 as well as the cover plate 7 which is only illustrated partially. The device housing 1 is subdivided in its inside into three compartments 10, 11, and 12 by means of, for example, two partitions 8, 9. A cathode ray tube (not illustrated) for displaying signals is mounted, for example, in the compartment 10. The compartment 11, for example, accepts printed circuit boards with components for signal processing or, respectively, for signal display. On the other hand, the compartment 12 serves for the acceptance of the inventive insulating body 13 which is designed as a box open toward the front into whose inside a total of four device inserts 15, 16, 17, and 18 can be inserted proceeding from the front opening 14. The compartment 12 of the device housing, thus, can also be defined, for example, as a recess which is lined with an insulating body 13 which in turn serves for the acceptance of inserts. However, the insulating body 13 itself can just as easily be designated as providing a recess which serves for the acceptance of device inserts. The device inserts are a component of the signal transmission system. On the inside, they can be constructed circuit-wise as is extensively described, for example, in the German Utility Model 77 36 156 (or, respectively, German Pat. No. 2,752,783). What is essential, however, is that each insert exhibits a cladding of insulating material with a high electric strength which, in addition to the printed circuit boards with components and metal shielding for said components, also carries the first half elements of a coupling location for energy and signal transmission in its inside, whereas the second half elements fitting thereto are specifically seated in the back surface of the insulating body 13 with a connection to the free space of the compartment 12, as shall be described in detail farther below.

The device illustrated in FIG. 1 is, specifically, an electromedical device. The inserts 15 through 18, thus, are a part of the signal transmission system for physiological signals which are taken at the body, of a patient by means of suitable sensors. To this end, thus, the sensors (not illustrated) are positioned on the body of the patient and are coupled via a signal cable (likewise not illustrated) to the respective inserts 15 through 18. The inserts 15 through 18, to this end, exhibits sockets 19 through 22 for the corresponding plugs of the signal cable. Of course, the employment of inserts in which the sensors are always permanently connected to the respective insert via signal cables (i.e., not in a plug-type connection) is also possible. The latter case is available when the individual insert housing is designed so as to be relatively low-volume. The insert with the permanently connected cable is then to be interpreted as the device plug itself.

In the exemplary embodiment of FIG. 1, the front panel 5 is specifically designed as a foil covered plate. All operating and/or display elements, thus, lie in the plane of the foil as is indicated by the symbols 23, 24. The same also applies to the image transmitting window 25 for the picture screen of the cathode ray tube to be incorporated or, respectively, also applies to the front surfaces of the inserted inserts 15 through 18. The front surfaces of the inserts, thus, likewise lie in the foil plane of the front panel 5 together with the incorporated operating and display elements 25 through 29 (28 and 29, for example, are luminescent diodes) which are only schematically illustrated. The disposition in one plane prevents the attachment of handles at the inserts with whose assistance plugged-in inserts can again be withdrawn from the recess of the device housing. In order, nonetheless, to be able to guarantee a rapid interchange of inserts, each insert is therefore specifically equipped with a discharge mechanism at the back wall of the insulating body 13, said discharge mechanism coming into action when a locking device which locks the insert in the hollow space after it has been inserted is released by means of manual actuation of an unlock key disposed at the device housing. The individual unlock keys for the inserts are indicated in FIG. 1 at the extreme right-hand edge of the front panel 5 and are referenced with the numerals 30 through 33. Further details relating to the format and functioning of the discharge mechanism in conjunction with the locking device are described farther below. In the exemplary embodiment of FIG. 1, 15, for example, is a $CO_2$ insert, 16 is an insert for pressure measurement, 17 is an insert for electrocardiographic measurement and 18 is a temperature insert. Of course, the insertion of any other insert for a different measurement signal is possible.

Figure 2:
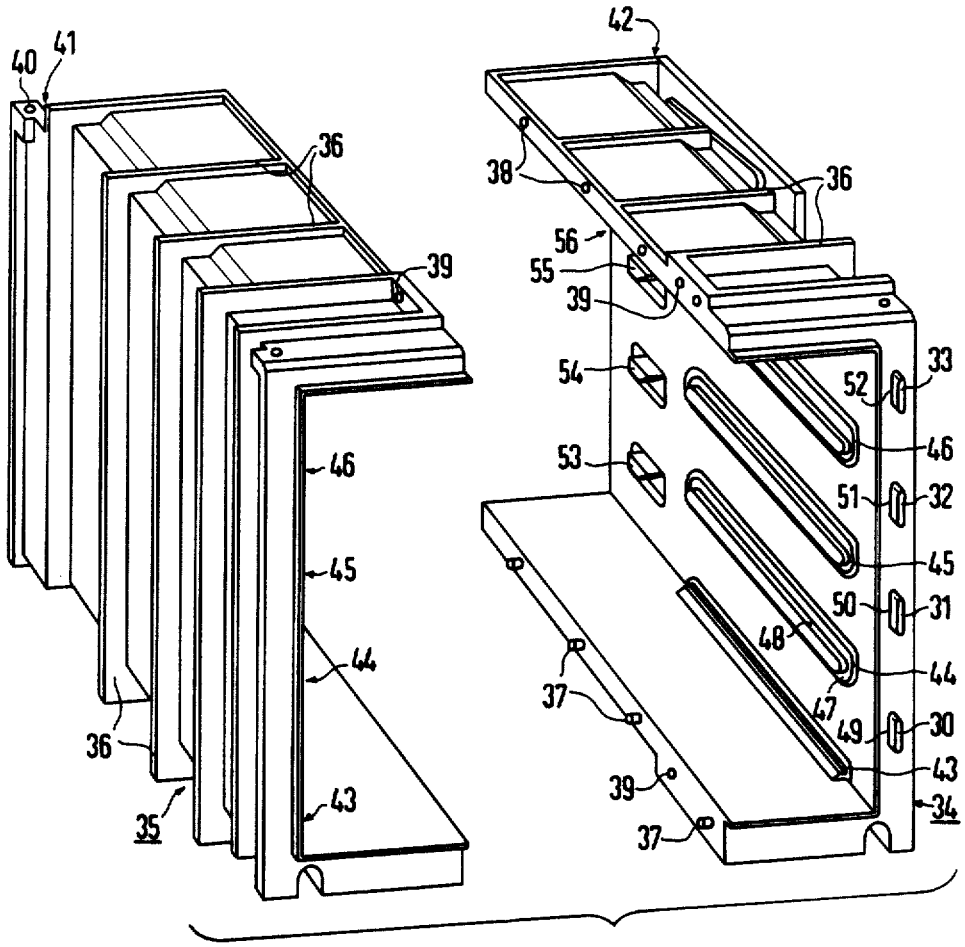
FIG. 2 shows an insulating body to be constructed of two mating C-shaped parts.

According to FIG. 2, the insulating body 13 is composed of two mating C-shaped parts 34 and 35. Both C-shaped parts are fabricated of synthetic amino-butadiene-styrol (ABS) which is easy to shape and which, moreover, is relatively price-favorable as well. In order, given a relatively large outside surface of the insulating body, to make do with as little insulating material as possible, the two parts 34 and 35 are specifically shaped as ribbed bodies. Each of the parts 34 and 35, thus, comprises ribs 36 at its perimeter which keep the inside wall of the insulating body, upon insertion of insulating layers consisting of air between the ribs, at a prescribable distance from the metal walls of the housing compartment 12. In the present case, the depth of the grooves, partially at the sidewalls of the parts 34, 35, amounts to approximately 7 mm. At the upper and lower surfaces of the parts 34, 35, the depth is decreased to a value up to approximately 3 mm for reasons of assembly. The thickness of the ribs amounts to approximately 1.5 mm. The material width of the inside wall of the parts 34, 35 amounts to approximately 3 mm. The insulating body composed of the two C-shaped parts 34 and 35 when assembled exhibits an outside width and depth of two inches by eight inches, measured from outside rib to outside rib. The height of the box-shaped insulating part lies at approximately 180 mm (corresponding to four height units). In the present exemplary embodiment, this dimensioning of the rib body 13 and the selection of the corresponding insulating synthetic materials leads to the fact that the capacitance between the metal parts within the housing of the inserts 15 through 18 and metal parts outside of the insulating body 13 (shielding walls of the compartment 12 of the device housing or, respectively, metal parts situated at the back wall of the insulating body 13) is limited to a value of less than 130 picofarads ($<130$ pF) related to an operating voltage of 220 V and an operating frequency of 50 Hz. Given this capacitance, an operating current which may possibly be fluctuating is at a safely low level of less than ten microamperes ($<10$ $\mu$A).

In FIG. 2, the two parts 34 and 35 of the insulating body have pins 37 at the mutually facing assembly edges at respectively one assembly edge of the one half part which fit to corresponding adjustment holes 38 at the mating edge of the other half part. After assembly of the two parts 34 and 35, said parts are screwed to one another at the assembly strips at the front via aligned screw holes 39 at the upper surface and corresponding aligned screw holes 39 at the base, so that only two screws secure the C-shaped parts 34, 35 together at the front. The analogous case applies to two corner screw holes 40 at the back of the upper surface of the C-shaped parts (only one hole 40 being visible in FIG. 2). The corner screw holes 40 are aligned with corner holes at the upper edge of an attachable back wall to fasten said back wall with parts 34, 35. The lower surfaces of the two C-shaped parts 34, 35, on the other hand, are pressed together at the back side by means of a specific shaping of the back wall which can be inserted into two grooves 41, 42 at the back longitudinal edges of the assembled C-shaped parts 34 and 35. When the back wall is inserted, the insulating body 13 composed of the two parts 34, 35 forms a box which is opened toward the front, into which the inserts can be inserted. For drawer-like insertion of the individual inserts 15 through 18, the two parts 34, 35 have longitudinal tracks 43 and 46 at their respective inside walls. Said longitudinal tracks are shaped in such manner that a relatively flat wall camber 47 is followed by a more greatly cambered longitudinal ridge 48 (illustrated on the example of track 44). This results in the fact that the insert to be inserted, carried by the respective ridge 48 of a guide rail 43 through 46, has its exterior sidewalls in sliding relation only to the slight camber 47, i.e., the exterior sidewalls of the insert do not slide against the inside wall of the insulating body at the entire lateral surfaces thereof. By so doing, a particularly low-friction operation of each insert ensues. The ridge cambers are slightly rounded; the cambered central ridge 48 fits to a corresponding slide channel at the longitudinal edges of each insert. Slide ridges 43 through 46 and slide channels at the inserts not only ensure low-friction sliding because of their rounded nature; the rounded ridges and glide channels also avoid sharp edges at which dirt easily builds up. This type of gliding seating is thus also optimally designed from the viewpoint of cleanliness. In FIG. 2, finally, the unlock keys for the system of locking levers are again indicated at the right-hand outside edge of the part 34 with 30 through 33. Thereby, the unlock keys 30 through 33 project from openings 49 through 52 of the edge of the part 34 to such an amount that, after assembly of the insulating body in the compartment 12 of the device housing 1, the end face of each catch key lies approximately in the plane of the cover foil of the front panel 5 when the front surface of the plate forming panel 5 is covered with the foil. The actuation of an unlock key 30 through 33 then ensues by means of pressure against the foil at the location of the unlock key. Pressing an unlock key 30 through 33 effects that, specifically in the present case, a catch lever is actuated via a lever system. The catch noses or latches of the respective catch lever which respectively engage in a groove at a lateral edge of the insert when the insert is in its inserted state are referenced with 53 through 56 in FIG. 2 at the back, inside of the right part 34. Further details concerning the format and functioning of the locking device proceed from the description to FIG. 4 which is yet to follow.

Figure 3:
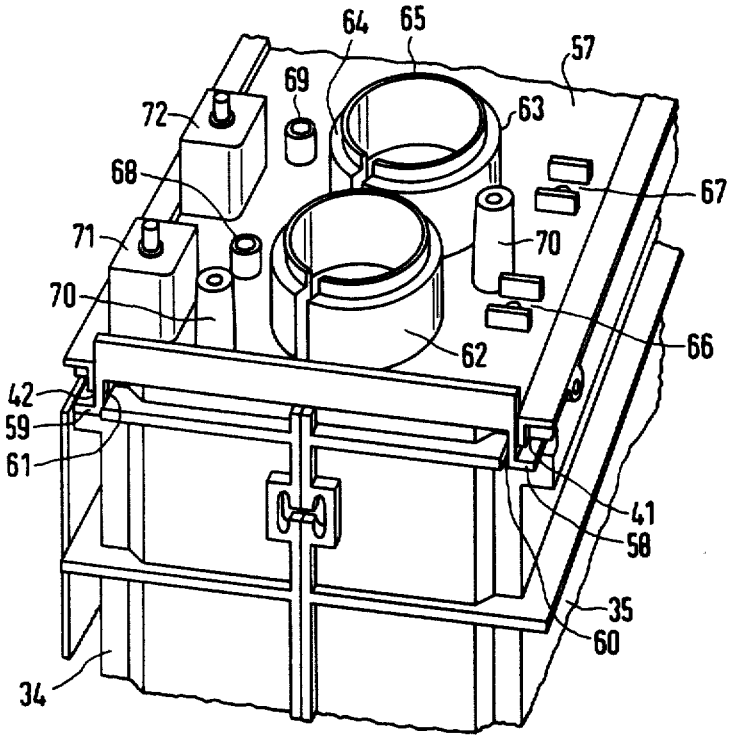
FIG. 3 shows the insulating body with attached back plate in a partial perspective view.

FIG. 3, in a partial view, shows the C-shaped insulating parts 34 and 35 (combined to form an overall body) obliquely from below and rotated by approximately 180° in comparison to the illustration of FIG. 2. The back plate 57 inserted into the grooves 41 and 42 is now also shown. Shortly before complete insertion of the plate 57, the flanged edges 58 and 59 of said back plate slide at their lowest end over two slightly inclined surfaces 60 and 61 at the back lower edges of the two C-shaped parts 34 and 35. Thus, the edges 58 and 59 exert pressure against the base portions of the two C-shaped parts 34, 35 via the increasing oblique surfaces 60 and 61. The two parts 34, 35 are pressed together at this location and thereby adhere well to one another to provide an encompassing insulating shell for surrounding the inserts 15–18, FIG. 1. The back plate 57 likewise consists of synthetic insulating material, preferably ABS again. It is not only the back terminating part of the insulating body 13; on the contrary, the back plate 57 also serves as a carrier of those partial elements of the coupling location which, as half parts, at the device side, fit to the half parts in the inside of the inserts. In FIG. 3, thus, the back plate 57 exhibits a total of four acceptance cylinders for transmission bodies for energy transmission of which, however, only two can be seen—referenced with 62 and 63—because of the partial illustration. The upper edge of each assembly cylinder 62, 63, etc. which faces away from the back plate 57 is tapered in a ridge-like manner. The shoulder 64 of the ridge tapering of the upper edge, thereby, serves as a seating surface for an assembly plate (151, FIG. 9) which is centered by means of the actual upper edge round ridge 65. The assembly plate is again the carrier of the transmission bodies (e.g. 153, FIG. 9) in a floating suspension. The assembly plate itself is seated on a printed circuit board (159, FIG. 9) on which the electronic components required for the energy transmission and signal transmission are mounted. In the present case, the signal transmission from the insert in the direction of the signal processing parts of the device ensues by means of luminescent diodes, preferably in the infrared range. For this purpose, four light receivers (for example, photodiodes) at the device side are provided as secondary signal coupling elements for a total of four transmit diodes which are disposed as primary signal coupling elements in the respective insert 15 through 18. The mounting niches for the light receivers are indicated on the mounting plate 57 with the numerals 66, 67, etc. Accordingly, inserts 68, 69 etc. for transmission diodes are provided on the back plate 57 of the insulating body for signal transmission (switching or other control signals) from the inside of the device housing in the direction of the inserts. The luminescent diodes to be employed there are then the primary coupling elements for a transmit case; the allocated receivers are seated as secondary coupling elements within the insert housing. If, thus, an insert 15 through 18 is inserted into a receiving position of the insulating housing 13 up to its final position, then an automatic coupling connection between coupling elements for energy transmission from the device to the insert and coupling elements for signal transmission both from the insert in the direction toward the device housing as well as from the device housing in the direction toward the insert is produced. In the exemplary embodiment of FIG. 3, the back plate 57, beyond that, also comprises threaded mounting sleeves 70 for screwing the printed circuit board carrying the mounting plate down, and the first two ejectors 71 and 72 of a total of four ejectors for a respective insert can be seen at the left side of the plate 57.

Figure 4:
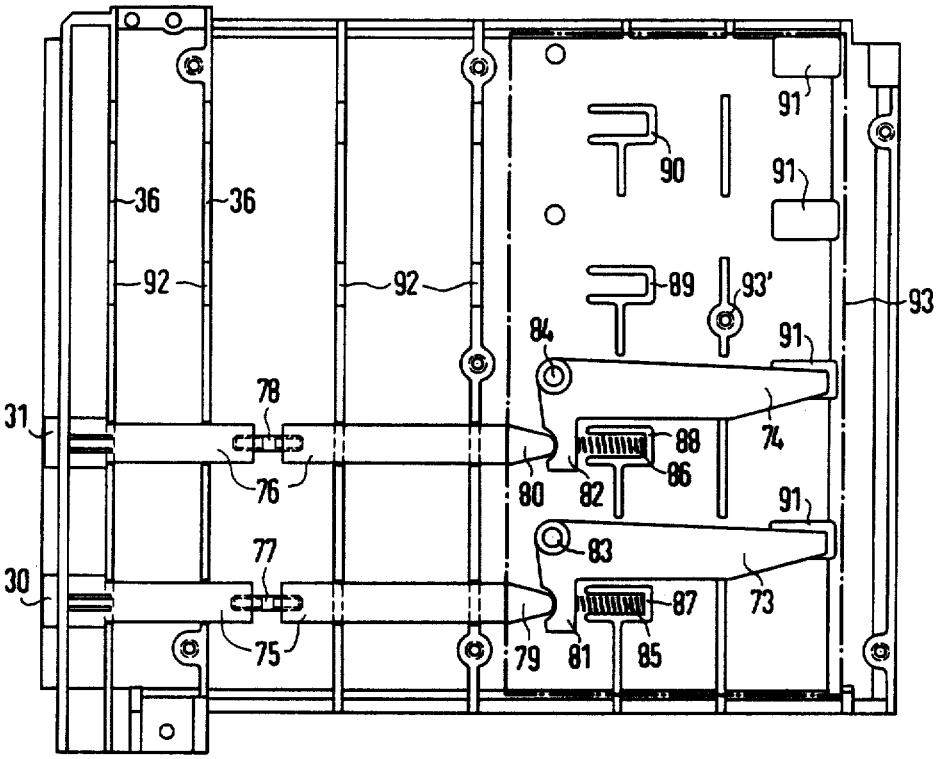
FIG. 4 is a side view of the insulating body with a system of locking levers for locking insert housings in the insulating body.

FIG. 4, as already indicated above, shows the right lateral wall of the insulating body 13 as seen from the opening, the lever system for the locking of the individual inserts 15 through 18 being mounted at said sidewall. For each insert, said lever system thereby comprises a catch lever 73, 74, etc. with the lock noses 53 through 56 illustrated in FIG. 2. An actuation lever 75, 76, etc., is allocated to each catch lever 73, 74, etc., said actuation lever 75, 76, etc. being deflected given pressure on the final unlock key 30, 31, etc. and actuating the catch level. Each deflection lever 75, 76, etc is comprised of two parts which can be adjusted to a desired overall length of the lever by means of a respective adjustment screw 77, 78, etc. Beyond that, each deflection lever 75, 76, etc., strikes via a pointed end 79, 80, etc. into a cavity of the end of the lock lever 73, 74, etc. facing away from the lock nose and bent off at approximately 90°. Given pressure on said cavity, accordingly, the lever is rotated toward the inside around its revolute joint 83, 84, etc. against the pressure of a spring 85, 86, etc. which is seated in a niche 87, 88, 89, 90 of the sidewall. Said rotation toward the inside of the one lever end leads to an upward rotation of the other lever end with the latches 53 through 56. The latches 53 through 56 projecting into the inside of the insulating body through the sidewall opening 91 are lifted upwardly. Each latch is lifted out of the corresponding catch groove of the insert and the insert is ejected from the insulating housing by the ejection mechanism. In the locking device of FIG. 4, the longitudinal levers 75, 76, etc. are seated in niches 92 of the ribs of the sidewall. In order to secure the lock lever 73, 74 in addition to the springs 85, 86 against ejection from their support mounts, there serves a synthetic plate 93 (illustrated with dot-dash lines) which is secured in place by means of a screw and a threaded hole 93' at the sidewall of the insulating housing above the levers and springs.

Figure 5:
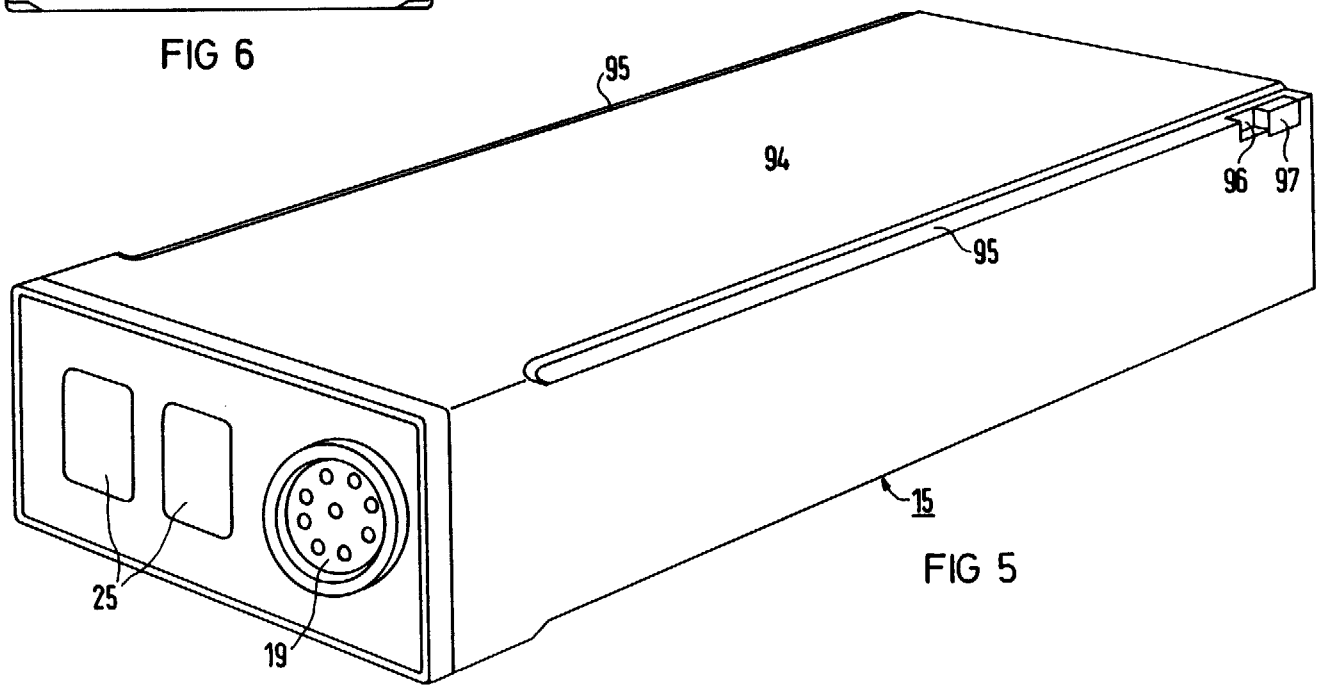
FIG. 5 shows an inventive insert housing in an oblique view.
Figure 6:
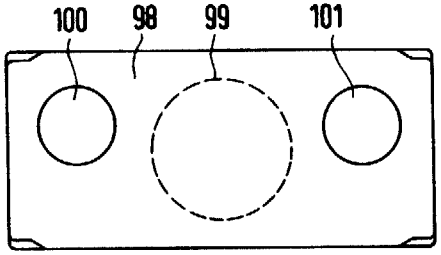
FIG. 6 shows the back surface of an insert housing according to FIG. 5.

FIG. 5 shows an exemplary embodiment of an insert, for example, of the insert 15 of FIG. 1. Each of the inserts comprises a jacket housing 94 of highly-insulating synthetic material, for example, ABS again, which is open only at its front side. Along its longitudinal edges, the highly-insulating jacket 94 is provided with the aforementioned well-rounded glide channels 95 *at the corner portions of the longitudinal sides* which are therefore also easy to clean. A latch-receiving groove 96 in which a block 97 consisting of hard synthetic material, particularly polyamide glass fiber, is bonded is situated at the back end of the right upper edge of the insert jacket 94. The hard block 97 protects the lock-in groove 96 against loads which are all too great due too the latch of the locking lever. The front opening of the jacket housing 94 of each insert is tightly closed with an insert front plate. FIG. 6 shows the back surface of a rear wall 98 of the jacket housing 94. In its center (indicated with broken lines), said rear wall 98 has its material thinned disk-like. The thinning at this location guarantees a particularly tight coupling of the transmission body (e.g. 137, FIG. 9) on the side of the insert to that transmission body (e.g. 153, FIG. 9) on the side of the device at the back plate 57 on the insulating body in the final position of the insert. Reference numerals 100 and 101 indicate two windows for the infrared light of the two signal transmission couplers of each insert. The window may be a red-dyed synthetic material or a true infrared transmitting filter. The two windows are acoustically irradiated into the rear wall 98 by means of ultrasonics in such manner as to be water and airtight as well as high voltage resistant.

Figure 7:
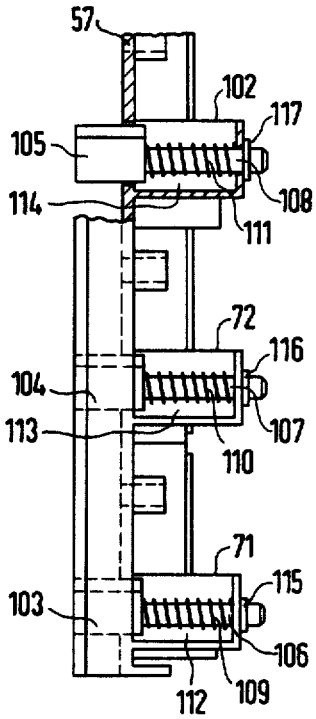
FIG. 7 shows an ejection mechanism for ejecting the insert housings, located at the back surface of the insulating body.

FIG. 7 shows the ejection mechanism at the back plate 57 of the insulating body in detail. In addition to the ejection blocks 71, 72 of FIG. 3, a third ejection block 102 is also illustrated. A fourth ejection block is no longer drawn in because of the partial illustration. Each block 71, 72, 102, etc., comprises a ram element 103, 104, 105, etc. Each of said ram elements is connected to a tappet 106, 107, 108, etc. which is resiliently mounted in the inside face 112, 113, 114, etc. of the respective ejection blocks by means of a helical spring 109, 110, 111, etc. Securing rings 115, 116, 117, etc.

serve for the external securing of the tappets. If, thus, an insert is inserted into that level of the insulating housing 13 allocated to it, then, due to the back wall of the insert, the ram element (of elements 103 through 105) together with one of the tappets 106 through 108, etc., situated at the level is pressed toward the back against the pressure of the associated one of springs 109 through 111 surrounding the tappets. Finally, the insert retained in its final position by means of one of latches 53 through 56 of the lock levers 73, 74, etc. presses against the ram element (103 through 105, etc.), until the locking is released by means of the lock lever by means of pressure on the appertaining unlock key (30 through 33) of the system of locking levers. The spring power of the cocked spring (109 through 111) then insures that the insert is ejected by the ejection element (103 through 105) from the inside of the insulating body, at least to such degree that it can be easily grasped by hand at its front side and be withdrawn. In a preferred embodiment, each tappet also trips a switch, particularly a microswitch, in such manner that the current supply to the primary transmitter on the device side is interrupted when an insert is ejected.

Figures 8A, 8B, 8C:
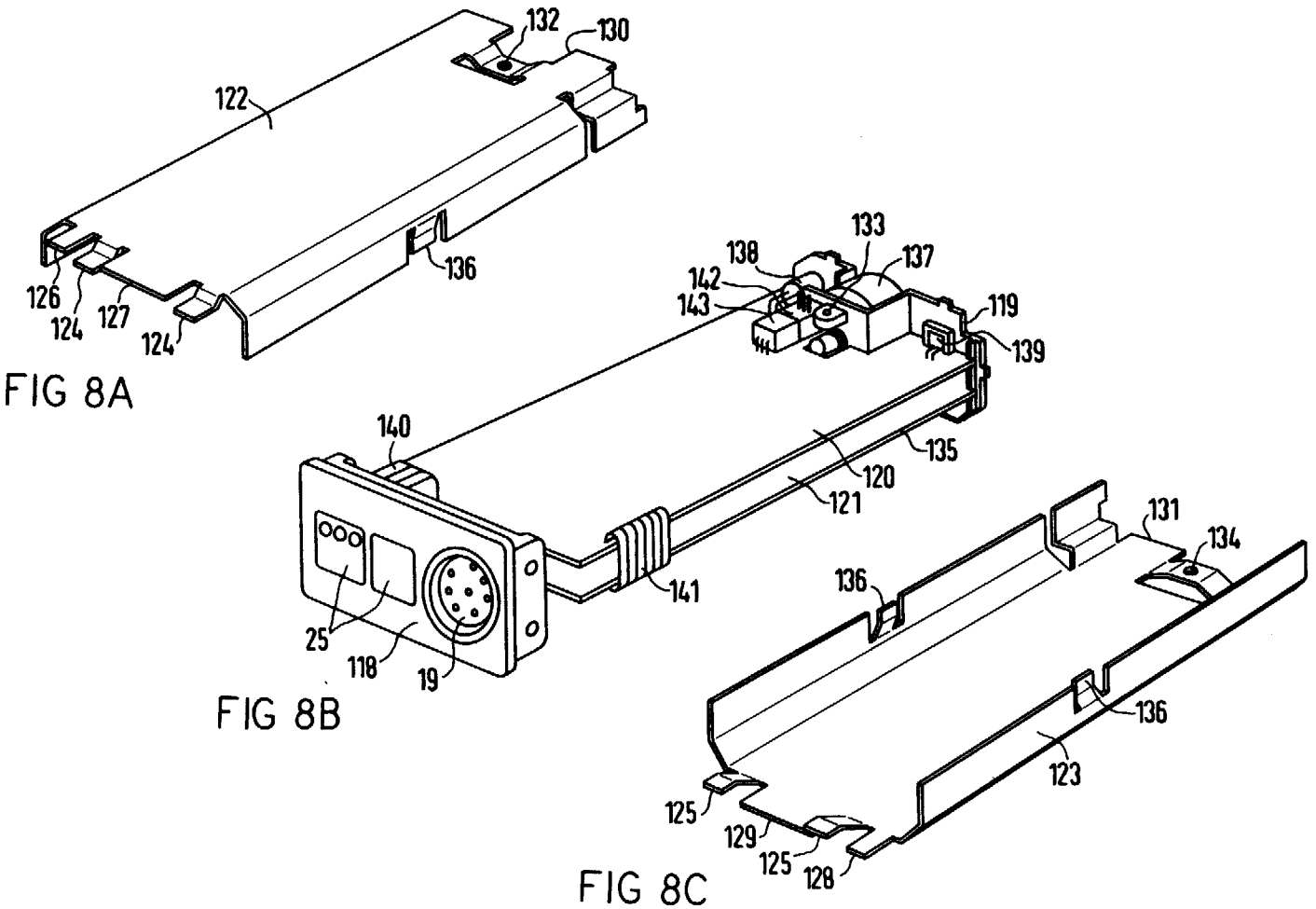
FIG. 8 comprised of FIGS. 8A, 8B, and 8C shows the internal format of an insert.

As an exemplary embodiment, FIG. 8 shows the internal format of an insert 15 through 18. Said internal format is characterized in that a total of two printed circuit boards 120 and 121 are mounted between the front part 118 of the insert and a back part 119 in the manner of a plug-type connection. The essential electronic components for energy and signal transmission are mounted on said printed circuit boards. This partial structure comprised of front and back surface as well as printed circuit boards, finally, is covered in a sandwich manner by means of two metallic shielding plates 122 and 123 (for example, consisting of aluminum or nonmagnetic sheet steel). Both shielding plates 122 and 123 are provided with claws 124 or, respectively, 125 at the front edge. When the respective plate is seated with flat edges 126, 127 or, respectively, 128, 129 on the inside shoulder of the front plate 118, the claws 124 or, respectively, 125 engage in recesses below the shoulder, so that a type of clamped connection for supporting the front edge of the two plates 122 and 123 is produced at the shoulder. The back edges 130 or, respectively, 131 of the plates 122 and 123, on the other hand, rest on the edges of the back part 119. They are screwed to the back part via screw holes 132, 133 or, respectively, 134, 135. The central parts of the shielding plates 122, 123, via claws 136, lie resiliently against the side edges of the printed circuit boards 120 and 121. In the same embodiment of FIG. 8, the back part 119 is fabricated of metallized synthetic material for the purpose of shielding. The back part 119, at the same time, is the carrier of half parts of coupling locations for energy and signal transmission. Thus, among other things, its carries a pot core in floating suspension for the acceptance of a coil body as a secondary part of a coupling location for energy transmission from the device to the insert. For signal transmission from the insert to the device, an inset for a transmit diode 138 (luminescent diode) is disposed at the left side and, for signal transmission from the device to the insert, a niche for a light receiver 139 (photodiode) is disposed at the right-hand side. A signal cable line 140 serves for the line-wise connection between the front plate 118 (foil front plate with integrated switches) of the insert and printed circuit boards 120, 121, whereas a signal cable line 141 is provided for the connection of the printed circuit boards to one another. A plug-type connection 142, 143 serves for the production of a line connection for the energy transmission from the coil body seated in the pot core 137 to the appertaining circuit part on the printed circuit boards. The plug 142 is seated at the back part 119; the plug 143 is disposed on the printed circuit board 120. In its assembled state, the overall structure of FIG. 8 can be inserted into the highly-insulating jacket housing 94 of the insert from the front side. An insert as is illustrated in FIG. 5 thus results.

Figure 9:
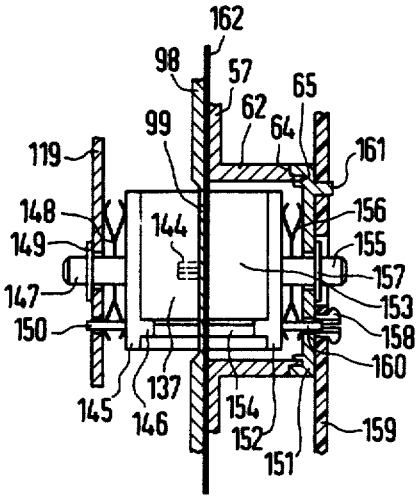
FIG. 9 shows a coupling element for energy connection, partially in section.

In a sectional detail, FIG. 9 shows a coupling location for energy transmission as is produced when an insert is brought into its final position in the insulating housing. In a partial sectional illustration, accordingly, the rear wall 98 of the insert housing 94 with a material thinning 99 in its center is again illustrated. The material thinning 99 is also provided with a centering cross 144. The transmitter carrier is referenced with 145. Said carrier carries the pot core 137 on the insert side already illustrated in FIG. 8 for acceptance of the coil body at the secondary side. The pot core 137 is slotted at 146, and the connection wires for the coil body are simultaneously conducted through the slot 146. The transmitter carried together with pot core and coil body is resiliently suspended by means of a suspension nipple 147 upon incorporation of a spring 148 at the back part 119. A retaining ring 149 secures the arrangement against falling out.

The suspension of the transmitter on the side of the device presents a similar structure. The back plate of the insulating housing 13 is again referenced with 57. In accord with FIG. 3, the back plate 57 carries, for example, the assembly cylinder 62 with shoulder 64 and centering ridge 65 of the ridge tapering of the upper edge. The mounting plate 151 for a transmitter carrier 152 at the device side with mounted pot core 153 with slot 154 for the coil body at the device side is seated on the upper edge of the acceptance cylinder 62 shaped in such manner. The transmitter structure is again suspended in a floating manner as the assembly plate 151 by means of support nipple 155 and spring 156 as well as retaining ring 157. The carrier of the assembly plate 151 is a printed circuit board 159 which carries the electronic components necessary for energy and signal transmission. A snap nipple 158 which is simply snapped into the printed circuit board serves for securing the assembly plate 151 to the printed circuit board 159. A mounting pin 160 between the transmitter carrier 152 and assembly plate 151 again serves to prevent twisting as does a pin 161 between the assembly plate 151 and the printed circuit board 159, whereas 162 is a very thin sealing foil which is stretched over the inside surface of the back plate 57.

Thus, what is achieved with the invention is not only that coupling capacitances between metal parts in the inside of the inserts and metal parts in the inside of the device housing can be kept as small as possible even given large-volume or, respectively, large-surface design of the plug-in type connection so that the leakage current also becomes negligibly small; but, beyond that, due to the special shaping of the insulating body and due to its particularly functional combination with further components such as, for example, ejection mechanism in conjunction with locking device, structural allocation of the individual components of each coupling location to one another, etc., a device is created which can be optimally and space-savingly employed in the sense of the invention. The illustrated embodiment itself has only exemplary character; it is self-understood that modifications of the structure described are possible in any desired form within the framework of the invention.

It will be apparent that many modifications and variations may be effected without departing from the scope of the novel concepts and teachings of the present invention.

We claim as our invention:

1. An insulated insert assembly comprising an insulated insert with high electric strength for insertion into a device recess of a device housing, said insulated insert comprising a jacket housing (94) of highly insulating synthetic material, a layer packet comprised of at least two shielding plates (122, 123) of metallic material, and a printed circuit board structure (120, 121) seated between said shielding plates, and a transmission component carried by said layer packet, said layer packet together with said transmission component being designed so as to be insertable into the highly insulating jacket housing (94), characterized in that the jacket housing (94) is open only at the front side to provide a front opening, said insert having a front plate (118) carried by the layer packet (120 through 123) for closing the jacket housing at its front side, said front plate fitting tightly in its dimensions into the front opening of the jacket housing (94), said insert having a back part (119) at the back thereof, the layer packet comprising a printed circuit board structure formed of a prescribable number of printed circuit boards (120, 121) which are secured at the front side to the front plate (118) of the insert and are secured at the back to said back part (119), the two metallic shielding plates (122, 123) being connected to the front plate (118) of the insert and to the back part (119) partially by interfitting type connection and partially by a screw-type connection.

2. An insulated insert assembly according to claim 1, which each shielding plate having claws (124, 125) and flat edges (126, 127; 128, 129), the front plate (118) having an inside shoulder and claw-receiving recesses therebelow, characterized in that, for an interfitting type connection to the front plate (118) of the insert, each shielding plate (122, 123) has the claws (124, 125) at its front edge disposed such that, when the respective shielding plate is seated with its flat edges (126, 127; 128, 129) on the inside shoulder of the front plate (118) of the insert, the claws (124, 125) engage in the recesses below the shoulder, so that a type of clamped connection for supporting the front edge of the two shielding plates is produced at the shoulder.

3. An insulated insert assembly according to claim 3, characterized in that, for producing a screw-type connection, the back edges (130, 131) of the shielding plates (122, 123) lie on the edges of the back part (119) at respective seating locations, and are screwed to the back part in the vicinity of the seating locations via screw holes (132, 133, 134).

4. An insulated insert assembly according to claim 1, characterized in that the central parts of the shielding plates (122, 123) have claws (136) engaging resiliently against the side edges of the printed circuit boards (120, 121) arranged between them.

5. An insulated insert assembly according to claim 1, characterized in that, for the purpose of further shielding, the back part (119) carrying the printed circuit boards and the shielding plates at their back ends is manufactured of metallized synthetic material, and the front plate (118) of the insert is likewise provided with a metallic shielding layer.

6. An insulated insert assembly according to claim 1, with said layer packet having means for providing a galvanically separating coupling location for transmission between said transmission component on said layer packet and a transmission component at the inside of the device housing when the insert is inserted into the device recess.

7. An insulated insert assembly according to claim 6, characterized in that said transmission component on said layer packet comprises an energy transmission component (137) for the transmission of energy via the galvanically separating coupling location, said back part (119) carrying said energy transmission component in a floating and resilient manner.

8. An insulated insert assembly according to claim 6, with said layer packet having an insulated partition wall (98) with reduced thickness of not greater than about one millimeter at the galvanically separating coupling location for accommodating transmission via said transmission component.

9. An insulated insert assembly according to claim 6, with said jacket housing (94) having a wall (98) via which light transmission is to occur, said wall (98) having windows (100, 101) of synthetic material having light transmission characteristics matched to the light to be transmitted, a luminescent diode (138) and a light receiver (139) carried by the insert in alignment with the respective windows.

10. An insulated insert assembly according to claim 6, with said transmission component on said layer packet comprising optical signal transmission means (138; or 139) to provide for signal transmission between the transmission component of the layer packet and a transmission component at the inside of the device housing when the insert is inserted into the device recess.

11. An insulated insert assembly according to claim 10, with said means providing said galvanically separating coupling location comprising a wall (98) of the jacket housing having a synthetic window (100; or 101) aligned with said optical signal transmission means (138; or 139) and having light transmission characteristics matched to the light being transmitted, said window being disposed air- and water-tight and high-voltage resistant in said wall.

12. An insulated insert assembly according to claim 6, with said means providing said galvanically separating coupling location comprising a wall which is of reduced thickness over a region (99) thereof aligned with said transmission component (137) in order to keep the spacing at the galvanically separating coupling location small and thus to keep energy losses low, said wall providing an insulated partition between said transmission component (137) on the side of said insert and a cooperating transmission component on the side of the device housing when the insert is inserted into the device recess.

13. An insulated insert assembly according to claim 12, with means resiliently biasing the transmission component (137) into precise flatwise engagement with said wall (98) at the reduced thickness region (99) thereof.

*14. An insulated insert with high electric strength for insertion into a device recess of a device housing, comprising:*

*(a) an elongated jacket housing of highly insulating synthetic material, said housing being open only at its front side to provide a front opening, said housing*

*having a back wall and longitudinal sides, said longitudinal sides having corner portions,*

*(b) a front plate that fits tightly into said front opening,*

*(c) signal receiving means for receiving electrical signals, said signal receiving means being attached to said front plate,*

*(d) electrical components disposed in the interior of said jacket housing and electrically connected to said signal receiving means for processing said electrical signals, said components comprising a transmission component,*

*(e) means at said back wall of said housing for providing a galvanically separating coupling location for transmission between said transmission component in the interior of said housing and a transmission component at the inside of a device housing when the insert is inserted into said device recess, and*

*(f) glide grooves extending along said longitudinal sides of said jacket housing, each of said glide grooves forming a well-rounded channel at corner portions of said elongated jacket housing for slidably supporting said insert when introduced into said device recess.*

*15. An insert according to claim 14, wherein said jacket housing is in the form of a rectangular parallel piped and wherein said glide grooves extend along all four corner portions longitudinal sides of said elongated jacket housing.*

*16. An insert according to claim 14, wherein said jacket housing is formed of amino-butadiene-styrol.*

*17. An insert according to claim 14, wherein one of said glide grooves of said jacket housing has a latch-receiving recess for receiving a latch when said insert is inserted into a device recess.*

*18. An insert according to claim 17, wherein said latch-receiving recess is provided with a block of hard material against which said latch abuts when said insert is inserted.*

*19. An insert according to claim 14, wherein said grooves are proportioned to engage a corresponding support on said device housing such that said longitudinal sides of said insert are spaced from said device housing thereby preventing contact between said longitudinal sides and said device housing when said insert is placed in said device recess.*

*20. An insulated insert for insertion into a device recess of a device housing, comprising:*

*(a) an insert housing of highly insulating synthetic material, said insert housing having a front wall, a back wall, longitudinal sides and elongated corner portions disposed along said longitudinal sides,*

*(b) signal receiving means attached to said front wall for receiving electrical signals, and*

*(c) signal coupling means at said back wall for providing a galvanically separating coupling location for transmission between said insert and said device housing when the insert is inserted into said device recess,*

*(d) said insert housing having elongated well-rounded glide support means in the form of grooves disposed along siad elongated corner portions of said insert housing thereby providing for limited surface interengagement with said device housing such that the insert is suspended by limited surface engagement with said device housing during insertion into said device recess.*

* * * * *